(12) United States Patent
Bunin et al.

(10) Patent No.: US 10,930,737 B2
(45) Date of Patent: Feb. 23, 2021

(54) TRANSISTOR CELL (71) Applicant: VISIC TECHNOLOGIES LTD., Nes Ziona (IL)

(72) Inventors: Gregory Bunin, Tel Aviv (IL); Ivan Fedorov, Bat Yam (IL); Yulia Roiter, Ashdod (IL)

(73) Assignee: VISIC TECHNOLOGIES LTD., Nes Ziona (IL)

( * ) Notice: Subject to any disclaimer, the term of this patent is extended or adjusted under 35 U.S.C. 154(b) by 0 days.

(21) Appl. No.: 16/462,645

(22) PCT Filed: Nov. 23, 2017

(86) PCT No.: PCT/IL2017/051281
§ 371 (c)(1),
(2) Date: May 21, 2019

(87) PCT Pub. No.: WO2018/096537
PCT Pub. Date: May 31, 2018

(65) Prior Publication Data
US 2019/0280089 A1 Sep. 12, 2019

Related U.S. Application Data (60) Provisional application No. 62/426,257, filed on Nov. 24, 2016.

(51) Int. Cl.
*H01L 29/06* (2006.01)
*H01L 23/522* (2006.01)
*H01L 29/20* (2006.01)
*H01L 29/40* (2006.01)
(Continued)

(52) U.S. Cl.
CPC ...... *H01L 29/0696* (2013.01); *H01L 23/5226* (2013.01); *H01L 29/0649* (2013.01);
(Continued)

(58) Field of Classification Search
None
See application file for complete search history.

(56) References Cited

U.S. PATENT DOCUMENTS

2006/0202272 A1   9/2006   Wu et al.
2007/0235775 A1   10/2007  Wu et al.
(Continued)

FOREIGN PATENT DOCUMENTS

EP   1306905   5/2003
EP   2400553   12/2011
(Continued)

OTHER PUBLICATIONS

International Search Report of Application No. PCT/IL2017/05128 dated Mar. 8, 2018.
(Continued)

*Primary Examiner* — Long Pham
(74) *Attorney, Agent, or Firm* — Pearl Cohen Zedek Latzer Baratz LLP (57) ABSTRACT

A GaN field effect transistor (FET) including a plurality of transistor cells. A gate metal layer of a transistor cell includes a gate-drain overhang (width 0.2 um to 2.5 um) and a gate-source overhang (width 0.3 um to 1 um), and a widening at each narrow edge of the transistor cell, wherein the width of the widening of gate metal layer (150) is of 2-5 um. A metal (1) layer of the transistor sell extends beyond metal (0) layer. A last metal layer includes a drain plate and a source plate, each having a trapezoid form. More than two vias are located at a widening for connecting the gate metal layer to the gate bus. More than six vias distributed along the longitudinal dimension of the transistor cell connect metal (1) layer to metal (0) layer. A plurality of type 2 vias connect metal (1) layer to the last metal layer.

4 Claims, 8 Drawing Sheets

(51) Int. Cl.
*H01L 29/417* (2006.01)
*H01L 29/778* (2006.01)
*H01L 29/43* (2006.01)
*H01L 29/423* (2006.01)

(52) U.S. Cl.
CPC ........ *H01L 29/2003* (2013.01); *H01L 29/404* (2013.01); *H01L 29/41758* (2013.01); *H01L 29/778* (2013.01); *H01L 29/41766* (2013.01); *H01L 29/4236* (2013.01); *H01L 29/435* (2013.01)

(56) References Cited

U.S. PATENT DOCUMENTS

| | | |
|---|---|---|
| 2015/0028384 A1 | 1/2015 | Cao et al. |
| 2015/0187693 A1 | 7/2015 | Stessin |
| 2016/0087074 A1 | 3/2016 | Prechtl et al. |
| 2017/0077276 A1 | 3/2017 | Suzuki et al. |
| 2017/0104064 A1 | 4/2017 | Aoki et al. |
| 2017/0117376 A1 | 4/2017 | Yang et al. |
| 2018/0026123 A1 | 1/2018 | Jeon et al. |
| 2019/0280089 A1* | 9/2019 | Bunin ................. H01L 23/5226 |

FOREIGN PATENT DOCUMENTS

| | | |
|---|---|---|
| JP | 2013098222 | 5/2013 |
| WO | WO2016042861 | 3/2016 |
| WO | WO 2016098391 | 6/2016 |

OTHER PUBLICATIONS

Extended European Search Report for European Patent Application No. 17873165.9, dated Apr. 9, 2020.

\* cited by examiner

TRANSISTOR CELL

CROSS-REFERENCE TO RELATED APPLICATIONS

This application is a National Phase Application of PCT International Application No. PCT/IL2017/051281, International Filing Date Nov. 23, 2017, entitled "Transistor Cell", published on May 31, 2018 as International Patent Application Publication No. WO 2018/096537, claiming the benefit of U.S. Provisional Patent Application No. 62/426,257, filed Nov. 24, 2016, which is incorporated herein by reference in its entirety.

BACKGROUND OF THE INVENTION

Various products and systems, such as televisions, electric-powered vehicles, radar systems, electric motor controllers, and/or uninterrupted power supply systems, may require the provision of a relatively large amount of electrical power, which may be transmitted from a high voltage power supply. Various types of semiconductor field effect transistors (FETs) may be used as power switches to perform switching functions that may be required by the products and/or systems.

SUMMARY OF THE INVENTION

According to embodiments of the invention, there is provided a GaN field effect transistor (FET) including a plurality of transistor cells having a longitudinal dimension, wherein each of the transistor cell may include: a silicon substrate; III-V nitride semiconductor layers; Ohmic metal layer including an Ohmic metal source terminal and an Ohmic metal drain terminal; a gate metal layer including a gate-drain overhang, a gate-source overhang and a widening at each narrow edge of the transistor cell, wherein a width of the gate-drain overhang is 0.2 um to 2.5 um, a width of gate-source overhang is 0.3 um to 1 um, and a width of the widening of the gate metal layer is of 2-5 um; a metal 0 layer; a metal 1 layer comprising a gate bus, wherein the metal 1 layer extends beyond the metal 0 layer along the longitudinal dimension of the transistor cell towards a center of the transistor cell, thus defining a second field plate, wherein a width of the second field plate is 3-6 um and an overlap between the metal 1 layer and the metal 0 layer is −1 um to 7 um; a last metal layer comprising a drain plate and a source plate, each having a trapezoid form; two first via 1 arrays, each located at a widening of the gate metal layer for electrically connecting the gate metal layer to the gate bus, wherein each of the first via 1 arrays includes more than two vias; more than six type 1 vias distributed along the longitudinal dimension of the transistor cell for electrically connecting the metal 1 layer to the metal 0 layer; and a plurality of type 2 vias electrically connecting drain areas from the metal 1 layer to the drain plate in the last metal layer and source areas from the metal 1 layer to the source plate in the last metal layer, wherein a gate metal layer, a metal 0 layer and metal 1 layer are isolated by a dielectric material.

According to embodiments of the invention, the GaN FET is a D-mode or E-mode GaN FET.

According to embodiments of the invention, the metal 1 layer includes apertures, extending along the longitudinal dimension of each of the transistor cells.

According to embodiments of the invention, a number type 2 vias electrically connecting drain areas from the metal 1 layer to the drain plate in the last metal layer is matched to a width of the drain plate and the number of type 2 vias electrically connecting source areas from the metal 1 layer to the source plate in the last metal layer is matched to a width of the source plate.

BRIEF DESCRIPTION OF THE DRAWINGS

The subject matter regarded as the invention is particularly pointed out and distinctly claimed in the concluding portion of the specification. For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The specification, however, both as to organization and method of operation, together with objects, features, and advantages thereof, may best be understood by reference to the following detailed description when read with the accompanying drawings in which:

DETAILED DESCRIPTION OF THE PRESENT INVENTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

The terms "plurality" and "a plurality", as used herein, include, for example, "multiple" or "two or more". For example, "a plurality of items" includes two or more items.

References to "one embodiment", "an embodiment", "demonstrative embodiment", "exemplary embodiments", "various embodiments" etc., indicate that the embodiment(s) so described may include a particular feature, structure, or characteristic, but not every embodiment necessarily includes the particular feature, structure, or characteristic.

Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

According to some demonstrative embodiments, semiconductor field effect transistors (FETs) may rely on silicon (Si) materials and/or other materials. For example, a FET may include a source terminal and a drain terminal, which may be used for connecting a power source to a load. A further terminal in the FET may be located between the sources and drain terminals, this terminal may be referred to as a gate terminal. The gate terminal may control resistance of a current carrying channel.

During operation, a voltage that may be relative to a common ground may be applied to the gate terminal. For example, the voltage may generate an electric field in the FET which may act to, for example, control the resistance thereof, and may serve to turn the transistor ON and/or OFF. For example, when the FET is turned ON, the voltage applied to the gate terminal may reduce the resistance in the current carrying channel so as to, for example, allow for relatively large current flow between the source and drain terminals. The total resistance between the source and drain terminals when the FET is turned ON may be referred to as the ON resistance of the transistor, Rdson According to some demonstrative embodiments, nitride based semiconductors, such as, for example Gallium Nitride (GaN) and Aluminum Nitride (AlN), may be characterized as having relatively large band gaps. For example, the band gaps may be ~3.4 eV for GaN and/or ~6.2 eV for AlN. For example, FETs which may include a nitride semiconductor layer structure may also include a small band gap layer adjacent to a large band gap layer. Those FETs may have a relatively high concentration of high mobility electrons which may be characterized as having a high saturation drift velocity. The high mobility electrons may accumulate in a narrow triangular potential well at an interface between the layers to form a relatively thin, sheet-like electron concentration, which may be referred to as a two-dimensional electron gas (2 DEG). Due to, for example, the geometric construction and/or location of the 2 DEG, electrons in the 2 DEG may generally exhibit very low donor impurity scattering, and as a result may have the relatively high electron mobility and/or velocity, on the order of, for example, 1800 cm2/V*s and 1.5×107 cm/s respectively. Concentrations of electrons in a 2may be as high as 1×1013/cm2. As a result of the above, for example, FET transistors may have a very low specific Rds(on).

According to some exemplary embodiments, FET transistors that operate by generating and/or controlling high mobility electrons in 2DEGs can be referred to as high electron mobility transistors (HEMT). Semiconductor layer structures that can include multiple layers of different composition may be referred to as having heterostructures, and interfaces between two adjacent layers of different composition may be referred to as heterojunctions. In some embodiments the technology involves a circuitry including a plurality of parallel connections of transistor cells.

According to some embodiments, the term "cell" or "transistor cell" may be used with embodiment of the invention to describe a basic device unit able to switch between a current flow mode and a voltage blocking mode. A GaN switch power transistor, or GaN FET may use one, two or more cells connected in parallel by metal interconnections to provide a predefined performance of the GaN transistor, e.g., enable higher currents and lower Rdson of the GaN FET.

As known in the art, GaN FET transistors are typically designed and build using known and well-established foundry specific design rules, which are typically provided as a process design kit (PDK). While basic operation and layer structure and function of the transistor cell disclosed herein is similar to GaN FET transistors, embodiments of the present invention largely deviate from known reference cells as will be described in details herein, and provide better performances in terms of miller ratio, Cgs and Cgd ratio, switching time and switching energy, etc.

Figure 1:
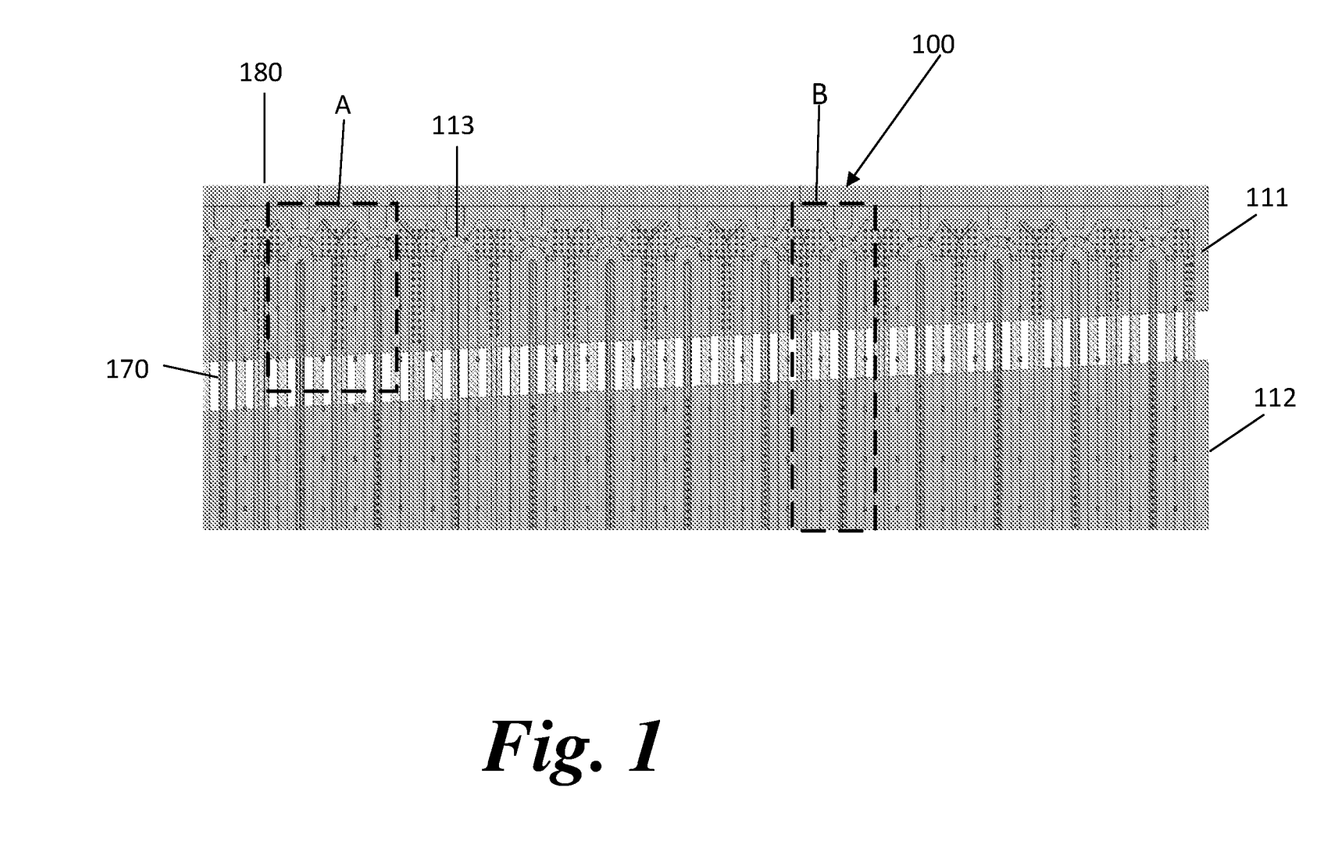
FIG. 1 is a schematic top view illustration of metal 1 layer and last metal layer of a plurality of adjacent transistor cells, according to some embodiments of the invention.

Reference is now made to FIG. 1 which is a schematic top view illustration of metal 1 layer 170 and last metal layer 180 of a plurality of adjacent FET cells, also referred to herein as transistor cells 100, according to some embodiments of the invention. Transistor cell 100 may be a D-mode or E-mode GaN FET. Area B in FIG. 1 generally defines a single transistor cell 100. As can be seen, transistor cell 100 may have a general longitudinal shape with two narrow edges 113, including a source plate 111 and a drain plate 112.

Figure 2:
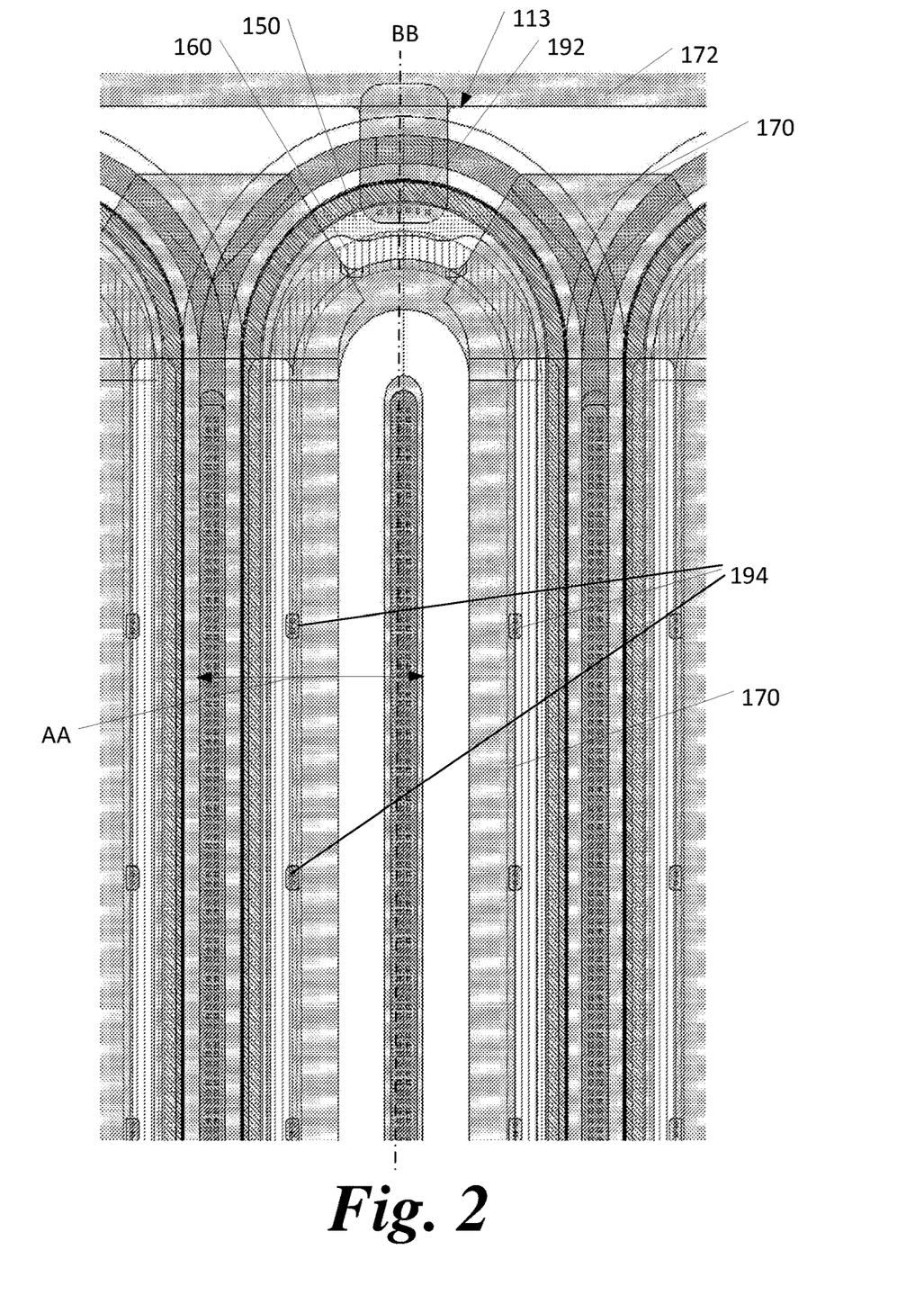
FIG. 2 is a schematic partial top view illustration of a gate metal layer, metal 0 layer and metal 1 layer of the transistor cell, according to some embodiments of the invention.

Reference is now made to FIG. 2 which is a schematic partial top view illustration of a gate metal layer 150, metal 0 layer 160 and metal 1 layer 170 of transistor cell 100, according to some embodiments of the invention. FIG. 2 is an enlarged view of area A marked on FIG. 1, with layers as defined above. Axis BB defines the center of transistor cell 100 along its longitudinal dimension.

Figure 3:
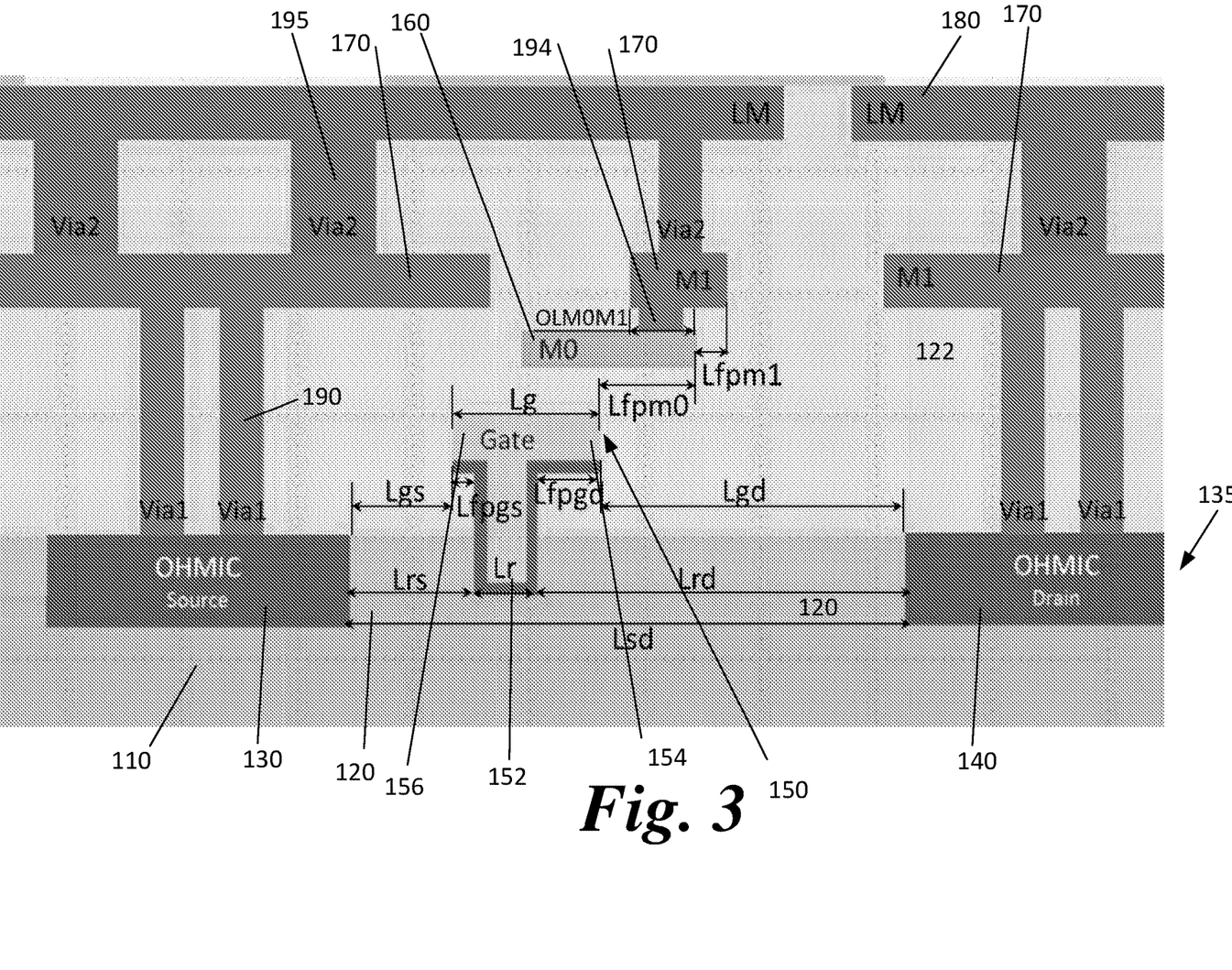
FIG. 3 is a schematic partial cross section illustration of an exemplary transistor cell, according to some embodiments of the invention.

Reference is now made to FIG. 3 which is a schematic partial cross section illustration of an exemplary transistor cell 100 along section line AA depicted in FIG. 2, according to embodiments of the invention. According to embodiments of the present invention transistor cell 100 may be a layered structure including the following layers, listed from bottom to top: a silicon substrate 110, III-V nitride semiconductor layers 120, Ohmic metal source terminal 130, Ohmic metal drain terminal 140, and a plurality of conductive metal interconnect layers isolated by a dielectric material 122. The metal layers may include (again listed from bottom to top) ohmic metal layer 135, gate metal layer 150, metal 0 layer 160, metal 1 layer 170 and last metal layer 180. The metal layers may be electrically interconnected as required by interconnecting vias, e.g., via 1 190 and via2 195. Ohmic metal layer 135 may include Ohmic drain 140 and Ohmic source 130.

Gate metal layer 150 may include a gate metal 152 which may be a protrusion extending from Gate metal layer 150 to semiconductor layers 120, in between Ohmic drain 140 and Ohmic source 130. According to some embodiments, a length of gate metal 152, marked as Lr on FIG. 3, may be in the range of 1 to 2.5 micrometer (um), excluding 2 um. This range is different from the reference length of gate.

Gate metal layer 150 may include a gate-drain overhang 154, which is an extension of gate metal layer 150 towards Ohmic drain 140, and a gate-source overhang 156, which is an extent of gate metal layer 150 towards Ohmic source 130. The width of gate-drain overhang 154, marked as Lfpgd on FIG. 3, and the width of gate-source overhang 156, marked as Lfpgs on FIG. 3, may affect the gate-drain capacitance, Cgd, and the gate-source capacitance, Cgs, of transistor cell 100, respectively. The width of gate-drain overhang 154, Lfpgd, may be in the range of 0.2 um to 2.5 um. The width of gate-source overhang 156, Lfpgs, may be in the range of 0.3 um to 1 um. Changing the width of gate-drain overhang 154 and of gate-source overhang 156 may change Cgd and Cgs, respectively, and may decrease the Cgd to Cgs ratio, which equals Miller ratio. As known decreasing the Miller ratio may improve the performance of transistor cell 100.

As known to those skilled in the art, widening gate-drain overhang 154 (increasing Lfpgd) provides a positive effect of reducing the electrical field and a negative effect of increased Miller effect. Reducing the width of gate-drain overhang 154 to the range specified herein has a risk of increasing the electrical field to a level that would improve the performance but in the same time would degrade the reliability of transistor cell 100. However, transistor cell 100 as disclosed herein provides desired reliability despite of the reduced width of gate field plate 154, while providing the advantage of a reduced Miller effect.

Figure 4:
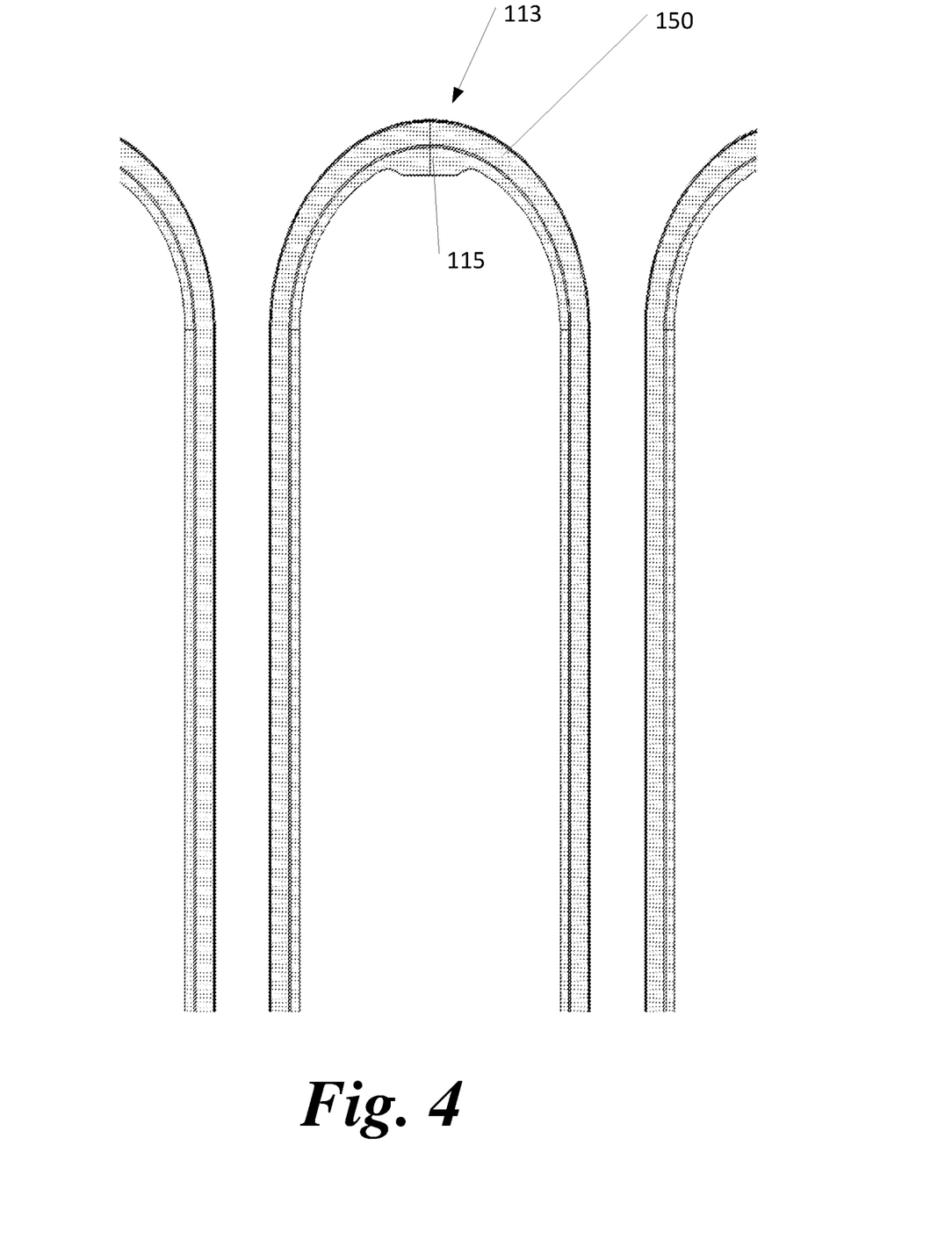
FIG. 4 is a schematic partial top view illustration of a gate metal layer of the transistor cell, according to some embodiments of the invention.

Reference is now made to FIG. 4 which is a schematic partial top view illustration of a gate metal layer 150 of transistor cell 100, according to some embodiments of the invention. Gate metal layer 150 may include a widening 115 at both sides of transistor cell 100, at the narrow edges of transistor cell 100. The width of widening 115 of gate metal layer 150 may be in the range of 2-5 um. Such configuration may improve the RC time constant of the gate or gate network, and may provide enlarged area for placing via 1 array 192 (e.g., an array including a plurality of type 1 vias) to electrically connect gate metal layer 150 to gate bus 172 that is part of metal 1 layer 170 (shown in FIG. 6 and FIG. 7). Via 1 array 192 of transistor cell 100 may be seen in FIGS. 2 and 6. Prior art designs typically include two vias for connecting the gate metal layer to the gate bus. The charge and discharge current of the gate capacitances typically flows through via 1 array 192. Having small number of vias in via 1 array 192 may lead to overheating of via 1 array 192, thus limiting or reducing the charge and discharge currents and reduce the reliability of the transistor. In addition, limitation of charging and discharging current causes degradation of switching time and reduce a system overall efficiency. Typical designs include only two vias, since known gate metal layers are not wide enough to enable placing more than two vias, since widening the gate metal layer may increase the parasitic capacitance between the source and the gate of the cell transistor, which is undesirable. The rounded shape and size of widening 115 as disclosed herein may provide a good tradeoff between charging and discharging current values and extra parasitic capacitance, and eliminates sharp edges that may cause premature breakdown of the transistor.

Figure 5:
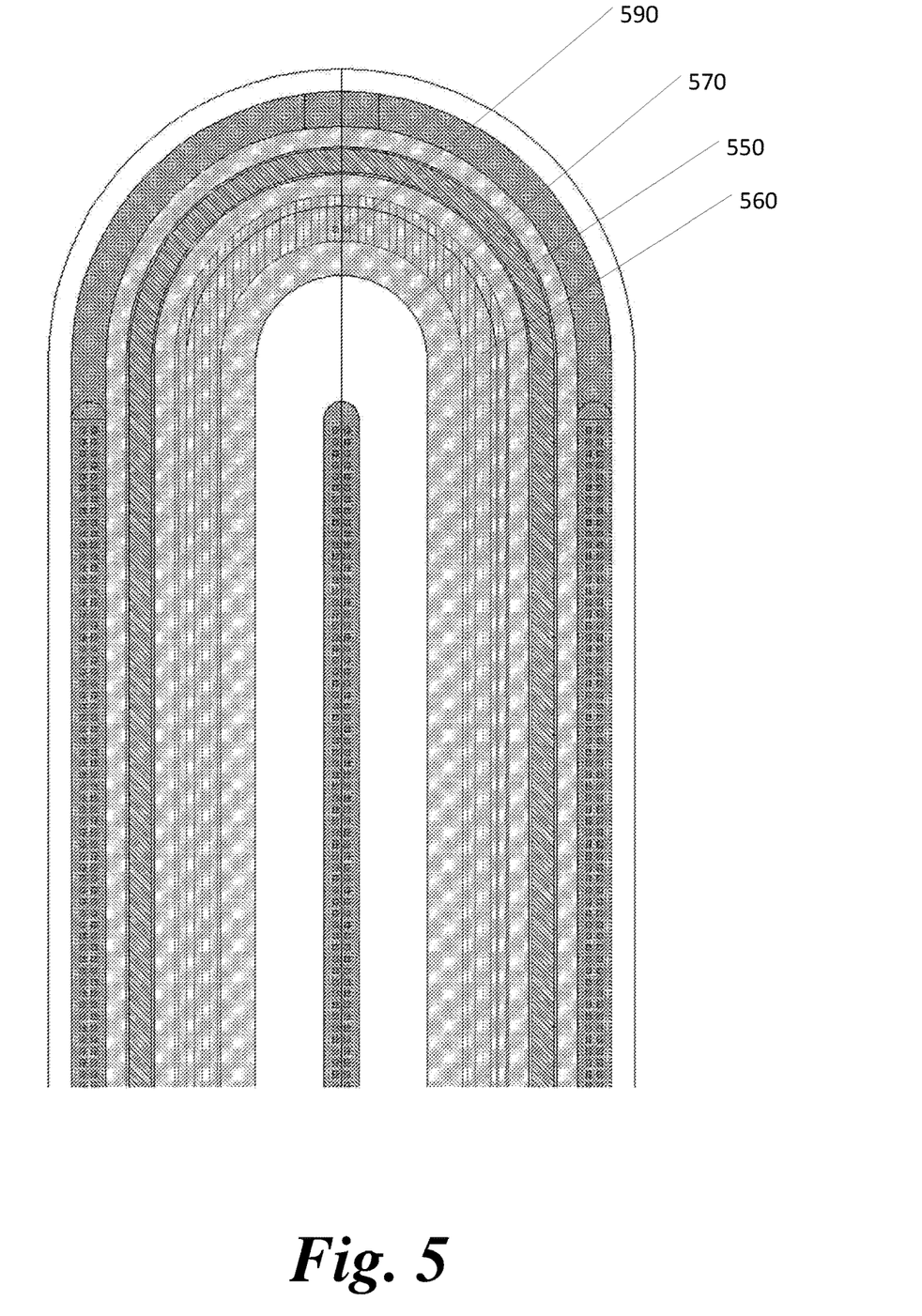
FIG. 5 is a schematic partial top view illustration of a gate metal layer, metal 0 layer and metal 1 layer and some other layers of the transistor cell.
Figure 6:
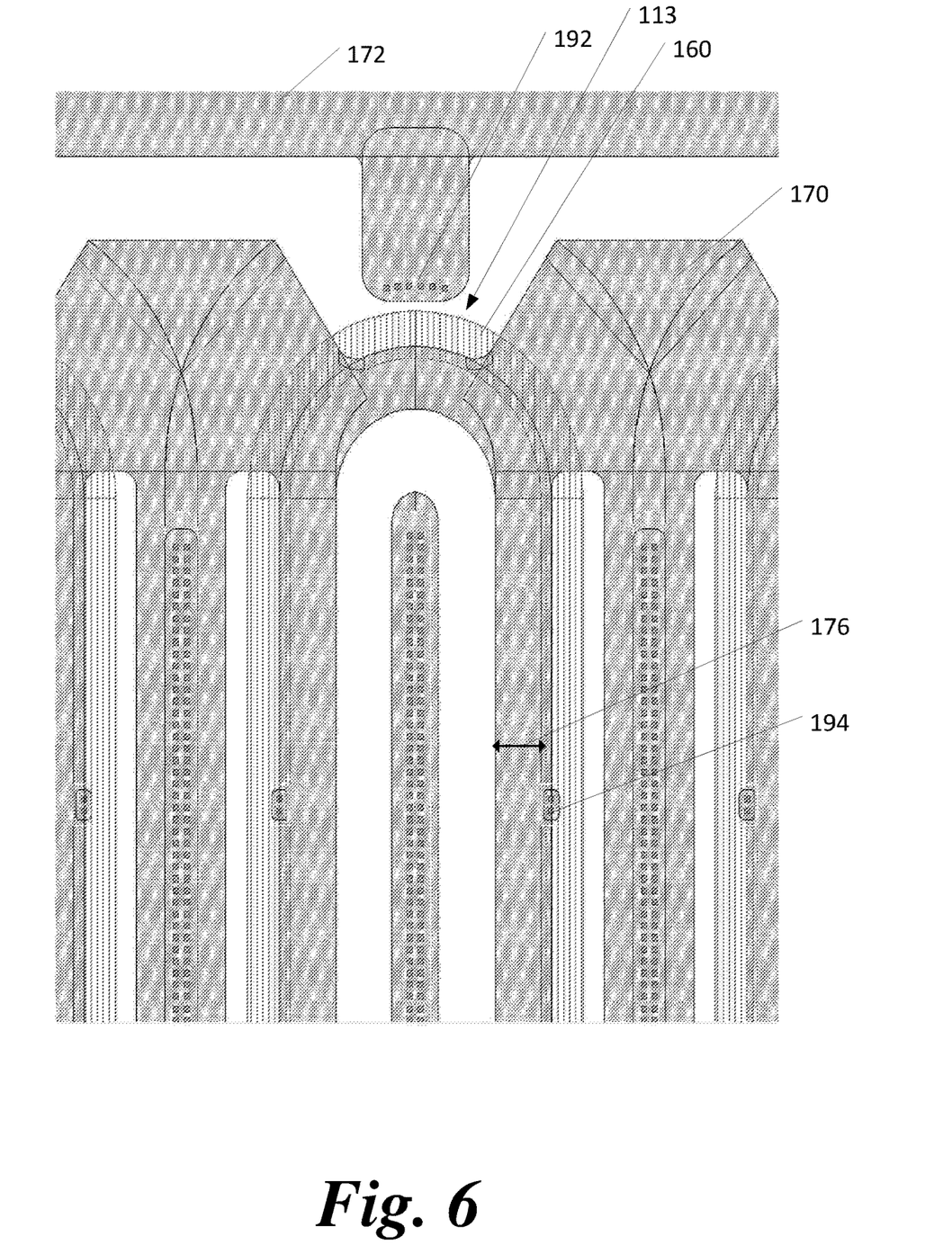
FIG. 6 is a schematic partial top view illustration of a gate metal layer, metal 0 layer and metal 1 layer of the transistor cell, according to some embodiments of the invention.

Reference is now made to FIG. 5 which is a schematic partial top view illustration of a gate metal layer 550, metal 0 layer 560 and metal 1 layer 570 of a reference transistor cell 500, and to FIG. 6 which is a schematic partial top view illustration of a metal 0 layer 160 and metal 1 layer 170 of transistor cell 100. Metal 1 layer 170 includes gate bus 172, and metal 1 layer 570 includes gate bus 572. FIG. 5 shows prior art connection of metal 1 layer 570 to metal 0 layer 560, while FIG. 6 shows metal 1 layer 170 connection to metal 0 layer 160, according to some embodiments of the invention. Vias 194 electrically connecting metal 0 layer 160 and metal 1 layer 170 are type 1 vias. In the prior art design depicted in FIG. 5, typically two type 1 vias 590 are placed in each rounded edge of transistor cell 500, thus, a total of four type 1 vias 590 connect metal 1 layer 570 to metal 0 layer 560. According to embodiments of the present invention, and as shown in FIG. 2 type 1 vias 194 are placed along the longitudinal dimension of transistor cell 100. As can be seen in FIG. 2, type 1 vias 194 may be distributed along the longitudinal dimension of transistor cell 100. Thus, the total number of type 1 vias 194 electrically connecting metal 0 layer 160 and metal 1 layer 170 may be more than 6. The advantage of using a more vias is that a large number of vias may provide a fast voltage distribution across metal 0 layer 160, which, in turn, improve the switching speed of transistor cell 100.

Still in FIG. 6 the relative positions of metal 1 layer 170 and metal 0 layer 160 according to some embodiments, is demonstrated. As can be seen, metal 1 layer 170 may extend beyond metal 0 layer 160 towards the center of transistor cell 100, and may create or define a second field plate 176. The width of field plate 176 which may be in a range 3-6 um according to embodiments of the present invention, is marked as Lfpm1 on FIG. 3. This may improve an electrical field distribution inside the gate-drain area of transistor cell 100. Overlap between metal 1 layer 170 and metal 0 layer 160, LOLM0M1 may vary from −1 um to 7 um (that is from being 1 um apart to having 1 um overlap), as desired.

Figure 7:
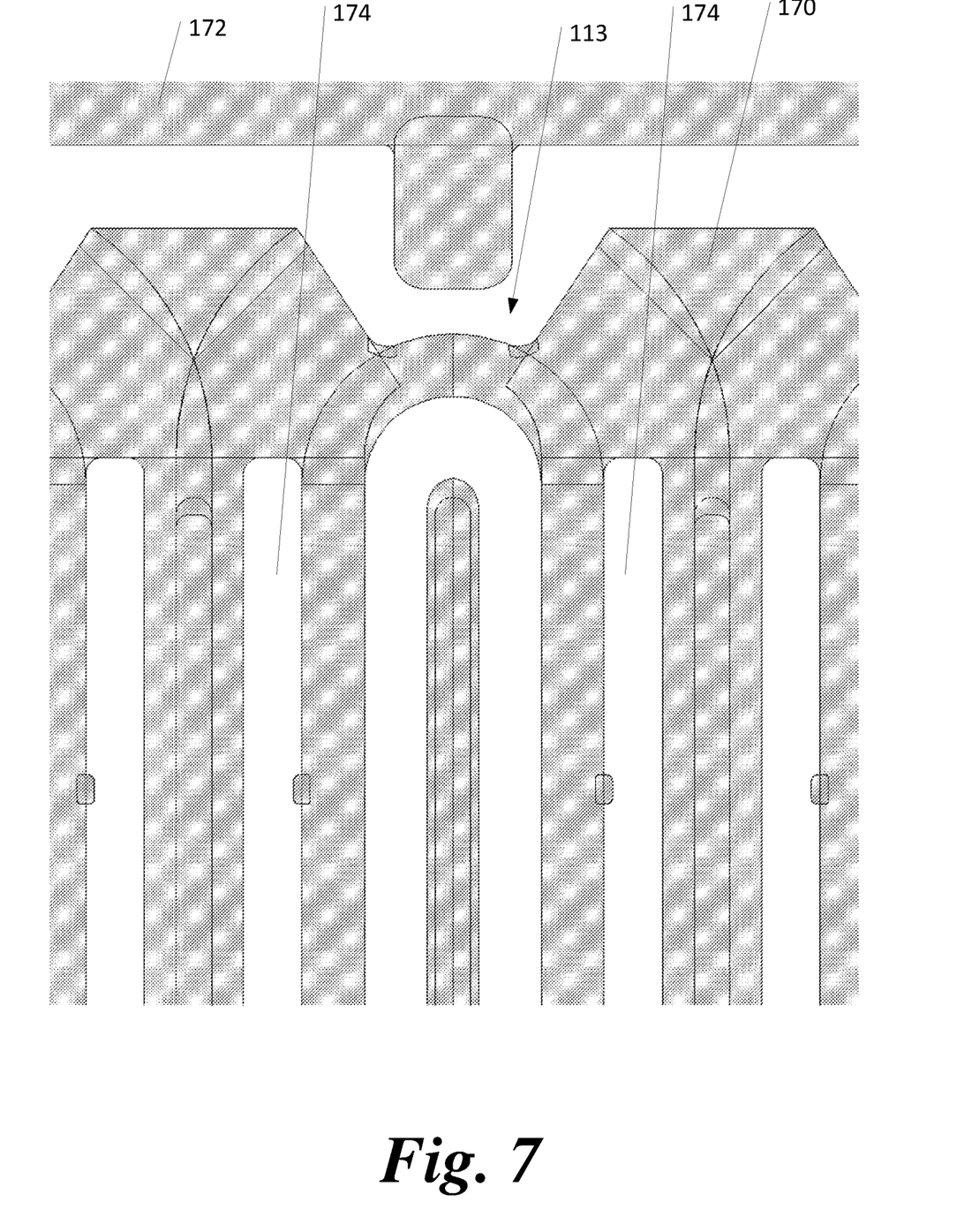
FIG. 7 is a schematic partial top view illustration of metal 1 layer (top part of the cell, including part of gate bus), according to some embodiments of the invention.

Reference is now made to FIG. 7 which a schematic partial top view illustration of metal 1 layer 170, according to some embodiments of the invention. According to some embodiments, metal 1 layer 170 may include apertures 174, which may extend along the longitudinal dimension of transistor cell 100. According to some embodiments apertures 174 may be located above the gate-drain area. The size shape and placement of apertures 174 in transistor cell 100 may affect a value of Cgd. Specifically, apertures 174 may decrease Cgd, which is desirable.

Figure 8:
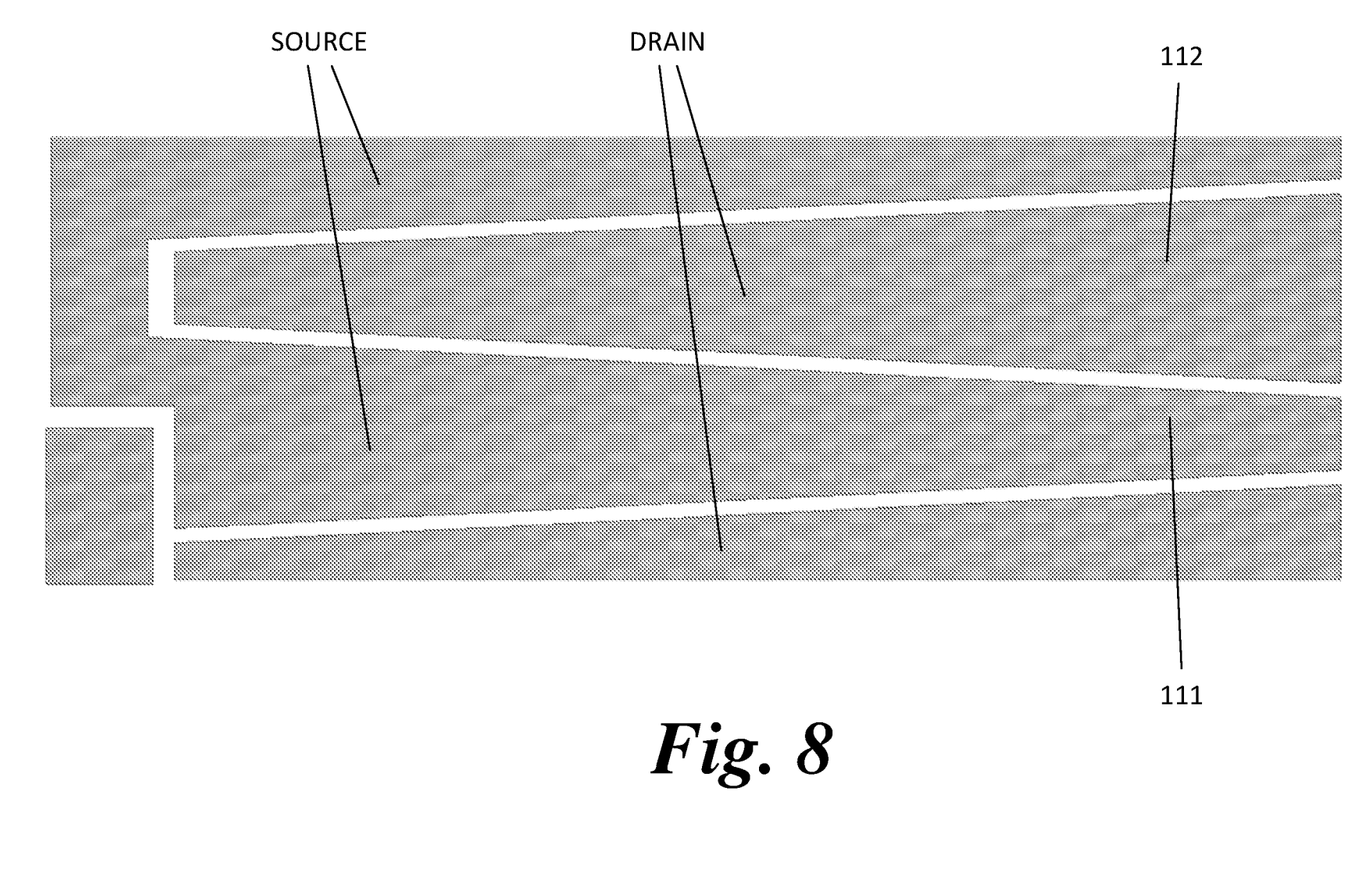
FIG. 8 is a schematic partial top view illustration of last metal layer, according to some embodiments of the invention.

Reference is now made to FIG. 8, which is a schematic partial top view illustration of last metal layer 180, according to some embodiments of the invention. According to some embodiments, last metal layer 180 may include a drain plate 112 and a source plate 111, each having a trapezoid form (e.g., a shape of a trapeze as illustrate in FIG. 8) and may extend under two rows of transistor cells 100. For example, source plate 111 may be "back to back" to the drain plate 112 so if a wide base of the trapezoid of drain plate 112 is at one side, the wide base of the trapezoid of source plate 111 is at the opposite side. Source plate 111 and drain plate 112 may provide a good electrical connection to metal 1 layer 170 through a type 2 vias 195 at source plate 111 and drain plate 112. Having a trapezoid drain plates 112 and source plates 111 on last metal layer 180 may help to keep a substantially uniform current density at transistor cell 100 along a drain plate 112 and source plate 111 due to bond pads location at the widest end of source and drain last metal layer electrodes. Last metal layer 180 is further described in U.S. Pat. No. 9,064,864 to the applicant of the present application, which is incorporated in its entirety herein by reference.

Returning to FIG. 1, placement of type 2 vias 195 electrically connecting metal 1 layer 170 to last metal layer 180, in accordance with some demonstrative embodiments is shown. According to some demonstrative embodiments, for example type 2 vias 195 may connect drain areas from metal 1 layer 170 to drain plate 112 in last metal layer 180 that collect drain current from different transistor cells 100. Similarly, type 2 vias 195 may connect source areas from metal 1 layer 170 to source areas 111 in last metal layer 180 that collect source current from different transistor cells 100. As can be seen in FIG. 1 the number or quantity of type 2 vias 195 is matched to the corresponding drain plate 112 or source plate 111 local size or width at last metal layer 180. For example, drain plate 112 in the rightmost cell in FIG. 1 is large or wider relatively to other cells and the number of type 2 vias 195 connecting metal 1 layer 170 to drain plate 112 in last metal layer 180 is respectively large. The source plate 111 for that cell, however, is relatively small or narrow and therefore, a relatively small number of type 2 vias 195 connect metal 1 layer 170 to source plate 111 in last metal layer 180 in this cell. The situation is reversed for the leftmost cell. Since the size or width of drain plate 112 and source plate 111 is designed with respect to the current density in these plates, e.g., drain plate 112 areas are larger or wider where the current density is expected to be higher and vice versa, the number of type 2 vias 195 increase in areas of high current densities.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed:

1. A GaN field effect transistor (FET) comprising a plurality of transistor cells having a longitudinal dimension, wherein each of the transistor cell comprises:
    a silicon substrate;
    one or more III-V nitride semiconductor layers;
    an Ohmic metal layer comprising an Ohmic metal source terminal and an Ohmic metal drain terminal;
    a gate metal layer comprising a gate-drain overhang, a gate-source overhang and a widening at each narrow edge of the transistor cell, wherein a width of the gate-drain overhang is 0.2 um to 2.5 um, a width of gate-source overhang is 0.3 um to 1 um, and a width of the widening of the gate metal layer is of 2-5 um;
    a metal 0 layer;
    a metal 1 layer comprising a gate bus, wherein the metal 1 layer extends beyond the metal 0 layer along the longitudinal dimension of the transistor cell towards a center of the transistor cell, thus defining a second field plate, wherein a width of the second field plate is 3-6 um and an overlap between the metal 1 layer and the metal 0 layer is −1 um to 7 um;
    a last metal layer comprising a drain plate and a source plate, each having a trapezoid form;
    two first via 1 arrays, each located at a widening of the gate metal layer for electrically connecting the gate metal layer to the gate bus, wherein each of the first via 1 arrays includes more than two vias;
    more than six type 1 vias distributed along the longitudinal dimension of the transistor cell for electrically connecting the metal 1 layer to the metal 0 layer; and
    a plurality of type 2 vias electrically connecting drain areas from the metal 1 layer to the drain plate in the last metal layer and source areas from the metal 1 layer to the source plate in the last metal layer,
    wherein a gate metal layer, a metal 0 layer and metal 1 layer are isolated by a dielectric material.

2. The GaN FET of claim 1, wherein the GaN FET is a D-mode or E-mode GaN FET.

3. The GaN FET of claim 1, wherein the metal 1 layer includes apertures, extending along the longitudinal dimension of each of the transistor cells.

4. The GaN FET of claim 1, wherein a number type 2 vias electrically connecting drain areas from the metal 1 layer to the drain plate in the last metal layer is matched to a width of the drain plate and the number of type 2 vias electrically connecting source areas from the metal 1 layer to the source plate in the last metal layer is matched to a width of the source plate.

* * * * *